(12) United States Patent
Kawasaki (10) Patent No.: US 8,098,365 B2
(45) Date of Patent: Jan. 17, 2012

(54) ILLUMINATION OPTICAL SYSTEM, EXPOSURE APPARATUS, AND DEVICE MANUFACTURING METHOD

(75) Inventor: Takafumi Kawasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 592 days.

(21) Appl. No.: 11/962,774

(22) Filed: Dec. 21, 2007

(65) Prior Publication Data

US 2008/0212061 A1    Sep. 4, 2008

(30) Foreign Application Priority Data

Jan. 11, 2007   (JP) .................................. 2007-003091

(51) Int. Cl.
  *G03B 27/54*   (2006.01)
(52) U.S. Cl. ........................................................ 355/67
(58) Field of Classification Search .................... 355/67, 355/71, 53
  See application file for complete search history.

(56) References Cited

U.S. PATENT DOCUMENTS

| 2001/0043318 A1* | 11/2001 | Mori | 355/53 |
| 2002/0140919 A1* | 10/2002 | Shiraishi et al. | 355/53 |
| 2005/0062949 A1* | 3/2005 | Irie | 355/53 |

FOREIGN PATENT DOCUMENTS

JP    5-251310 A    9/1993

* cited by examiner

*Primary Examiner* — Peter B Kim
(74) *Attorney, Agent, or Firm* — Canon U.S.A., Inc. IP Division (57) ABSTRACT

An illumination optical system which illuminates a plane to be illuminated using light from a light source, includes a first integrator and a second integrator disposed in order from the light source, a diaphragm having an aperture of constant area and disposed between the first integrator and the second integrator and close to the first integrator and an irradiation range adjustment unit configured to adjust an irradiation range of the light from the light source on a plane where the diaphragm is disposed, the irradiation range includes the aperture.

12 Claims, 8 Drawing Sheets

ILLUMINATION OPTICAL SYSTEM, EXPOSURE APPARATUS, AND DEVICE MANUFACTURING METHOD

BACKGROUND OF THE INVENTION

1. Field of the Invention

The present invention relates to a light quantity adjusting apparatus, an exposure apparatus, and a device manufacturing method.

2. Description of the Related Art

A stepper (i.e., a one-shot-type projection exposure apparatus) and a scanner (i.e., a scanning-type projection exposure apparatus) can be used to manufacture a semiconductor device. The scanner is operable according to a step-and-scan method that includes moving a reticle and a wafer synchronously relative to a projection optical system and exposing the reticle to light so that a pattern image of the reticle can be transferred onto each shot region of a wafer.

Similar to the one-shot-type projection exposure apparatus, the scanning-type projection exposure apparatus requires an exposure amount control mechanism that can minimize unevenness of illuminance so that an exposure amount (integrated exposure amount) at each point of each shot region on the wafer can be equalized to a target exposure amount.

Figure 6:
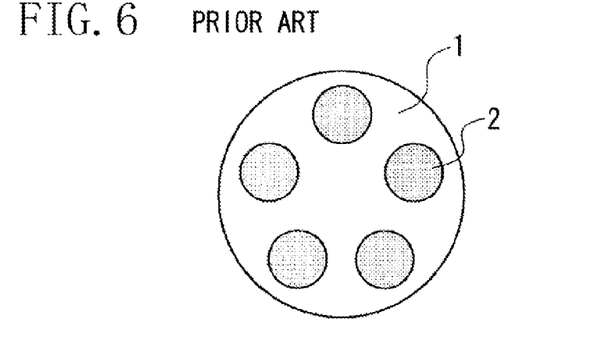
FIG. 6 illustrates a conventional turret including a plurality of ND filters.

As discussed in Japanese Patent Application Laid-Open No. 8-236439, a conventional system can adjust an exposure amount by controlling at least one of a light quantity adjustment unit (e.g., a neutral density filter) or the pulse laser oscillation frequency. FIG. 6 illustrates a conventional light quantity adjustment unit that includes a plurality of neutral density (ND) filters 2 which are mutually different in transmissivity and disposed on a turret 1. The light quantity adjustment unit can switch the ND filter 2 positioned across the optical axis to select a desirable transmissivity (i.e., adjust the quantity of light).

An exposure control attaining a required accuracy can be realized by effectively using the above-described adjustment methods. If the above-described adjustment methods are both used, a pulse control according to the beam attenuation effect can be realized. An accurate exposure amount control can be realized based on a pulse width modulation.

Figure 7:
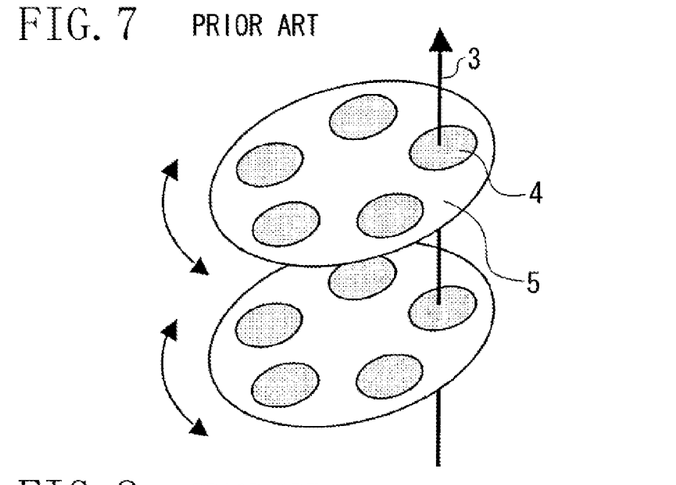
FIG. 7 illustrates a conventional two-stage turret mechanism including ND filter turrets serially disposed on an optical axis.

Furthermore, as illustrated in FIG. 7, a conventional system discussed in Japanese Patent Application Laid-Open No. 5-251310 includes a total of five (i.e., a plurality of) ND filters 4 disposed on each of two turrets 5 which are serially disposed on an optical axis 3 of illumination light. This conventional system can realize a speedy light quantity adjustment by changing a combination of the ND filters 4 of two turrets 5 to attenuate the quantity of light, compared to a system using a single turret including a plurality of ND filters.

More specifically, the conventional system of FIG. 7 can realize a total of 25 (=5×5) beam attenuation levels by changing a combination of the ND filters 4 of the turrets 5. It is needless to say that a large-scale turret is required if twenty-five ND filters are disposed on the same turret. A complicated hardware arrangement, including a mechanism for speedily switching numerous ND filters, is required.

Figure 8:
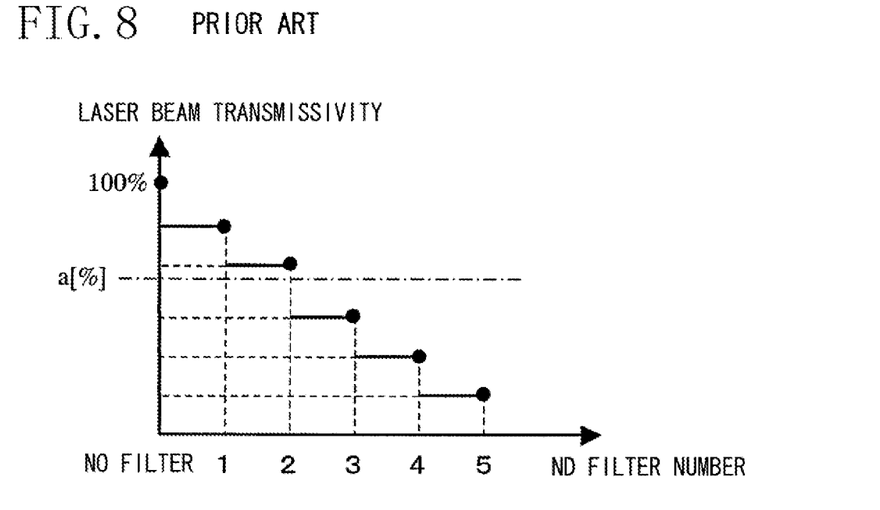
FIG. 8 is a graph qualitatively illustrating a conventional discrete beam attenuation adjustment.

FIG. 8 illustrates a conventional light quantity adjustment (discrete light quality levels) realized by switching ND filters. In FIG. 8, the abscissa axis represents an ND filter number, and the longitudinal axis represents the laser beam transmissivity. To simplify the description, it is now presumed that ND filters are serially disposed to constitute a turret of single stage. The transmissivity decreases when the ND filter number increases.

As apparent from FIG. 8, the change of the laser beam transmissivity is stepwise. In other words, this conventional system cannot realize any intermediate transmissivity between fixed transmissivities unique to respective ND filters. For example, the system cannot realize an intermediate transmissivity "a" [%] between two transmissivities of the second and third filters. In this case, the system selects the second filter because the transmissivity of the second filter is closest to the intermediate transmissivity "a."

On the other hand, a conventional system can control an exposure scanning speed or the oscillation frequency of a light source laser to accurately control an exposure amount. However, if the scanning speed is high, the apparatus requires a high-performance driving mechanism and therefore the apparatus cost increases. If the scanning speed is low, the throughput may be insufficient.

Furthermore, if the oscillation frequency of a light source laser is high, the life of the laser may decrease. On the other hand, if the oscillation frequency of the light source laser is low, unevenness of illuminance may occur.

To solve the above-described problems, the following method may be employed to decrease a difference between a desired transmissivity and a realizable transmissivity. The method uses an increased number of stages for a plurality of ND filters to decrease the gap between unique transmissivities (i.e., stepwise or discrete transmissivities in the longitudinal axis).

However, this method requires a great number of ND filters and a complicated hardware arrangement. The cost increases correspondingly. Therefore, an appropriate optimization is required not only to decrease the cost and the apparatus scale but also to increase the accuracy in the light quantity adjustment. As a result, the number of stages is limited. The gap between the stepwise or discrete transmissivities in the longitudinal axis cannot be decreased to an intended level.

SUMMARY OF THE INVENTION

Exemplary embodiments of the present invention are directed to a light quantity adjusting apparatus that can perform a continuous (non-discrete) light quantity adjustment, without increasing the complicatedness of the hardware arrangement, and can attain a desirable resolution in the light quantity adjustment.

According to an aspect of the present invention, an illumination optical system which illuminates a plane to be illuminated using light from a light source, includes a first integrator and a second integrator disposed in order from the light source, a diaphragm having an aperture of constant area and disposed between the first integrator and the second integrator and close to the first integrator and an irradiation range adjustment unit configured to adjust an irradiation range of the light from the light source on a plane where the diaphragm is disposed, the irradiation range includes the aperture.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments and features of the invention and, together with the description, serve to explain at least some of the principles of the invention.

DETAILED DESCRIPTION OF THE EMBODIMENTS

The following description of exemplary embodiments is illustrative in nature and is in no way intended to limit the invention, its application, or uses. It is noted that throughout the specification, similar reference numerals and letters refer to similar items in the following figures, and thus once an item is described in one figure, it may not be discussed for following figures. Exemplary embodiments will be described in detail below with reference to the drawings.

A light quantity adjusting apparatus according to an exemplary embodiment of the present invention is employable as an illumination optical system for an exposure apparatus that controls an exposure amount at a predetermined exposure area to a predetermined exposure level. The exposure apparatus is, for example, a step-and-repeat projection exposure type (e.g., a stepper) or a step-and-scan projection exposure type (i.e., a scanner) that is configured to project a pattern of a reticle (original) onto a wafer (substrate).

The light quantity adjusting apparatus according to an exemplary embodiment can be applied to a scanning exposure apparatus including an illumination optical system that emits exposure illumination light toward a specific illumination area on an original (i.e., plane to be illuminated (target plane)) on which a pattern to be transferred is formed. The scanning exposure apparatus performs a scanning in an exposure area of the substrate conjugate to the illumination area in synchronism with the scanning of the original (original plate) relative to the illumination area.

For example, the exposure light source is an excimer laser, such as ArF excimer laser having a wavelength of approximately 193 nm, KrF excimer laser having a wavelength of approximately 248 nm, or $F_2$ excimer laser having a wavelength of approximately 153 nm. However, the type of the laser is not limited to excimer lasers.

For example, the exposure light source may be a YAG laser. The number of lasers is not limited to one. A light flux shaping optical system can be used for a laser light source to convert a parallel light flux from the laser light source into a beam of a desired shape. An incoherent optical system can be also used to convert a coherent laser beam into an incoherent beam. Furthermore, the light source may be one or a plurality of mercury lamps or xenon lamps.

First Exemplary Embodiment

Figure 1:
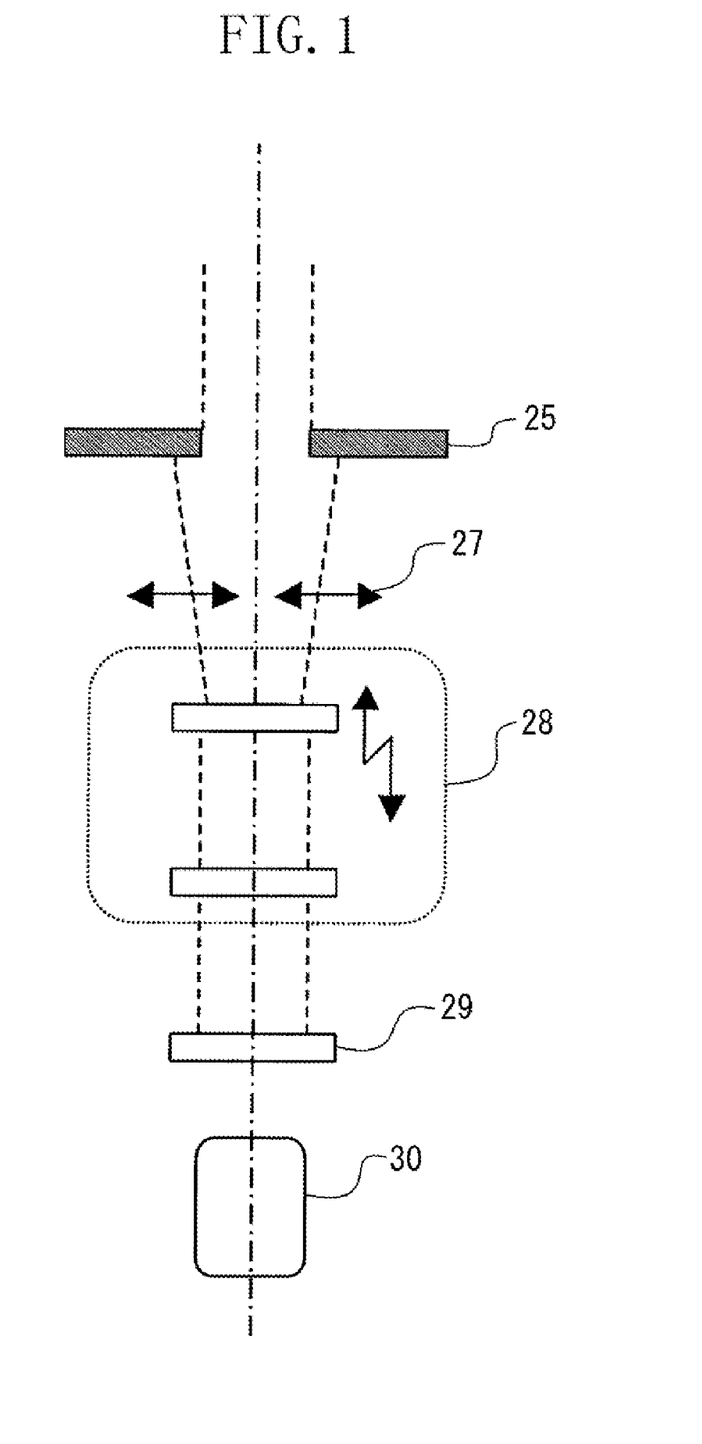
FIG. 1 illustrates a light quantity adjusting apparatus for an illumination optical system according to a first exemplary embodiment of the present invention.

FIG. 1 illustrates a light quantity adjusting apparatus for an illumination optical system according to the first exemplary embodiment. The light quantity adjusting apparatus of the present embodiment includes a zoom optical system 28 and a diaphragm 25. The zoom optical system 28 functions as an irradiation range adjustment unit disposed on an optical path of a laser beam emitted from a light source 30. The zoom optical system 28 can vary an irradiation range 27. The diaphragm 25 has a fixed aperture whose diameter or area is constant. The diaphragm 25 is disposed on a pupil plane of the illumination optical system.

The zoom optical system 28 includes a movable optical element which performs a zooming operation. The zoom optical system 28 can enlarge or reduce (adjust) an irradiation range of the light traveling toward an area including the fixed aperture of the diaphragm 25 from the light source 30. Thus, the zoom optical system 28 can adjust the quantity of illumination light passing through the fixed aperture (i.e., quantity of light on the light receiving surface).

An exemplary embodiment using the above-described light quantity adjusting apparatus can continuously change an attenuation amount of the light emitted from the light source 30 (i.e., the quantity of light passing through the diaphragm 25).

The light quantity adjusting apparatus can include one or more neutral density (ND) filters 29. For example, two or more ND filters are disposed and changed on the same turret and a selected one of the ND filters can be disposed across the optical path. The exemplary light quantity adjusting apparatus illustrated in FIG. 1 includes the ND filter 29 and the zoom optical system 28.

If two or more ND filters are used, the light quantity adjusting apparatus can realize continuous (non-discrete) light quantity adjustment. In other words, the light quantity adjusting apparatus according to an exemplary embodiment can compensate the discreteness (i.e., stepwise changes caused by the switching of ND filters) in the light quantity adjustment according to a conventional system.

The light quantity adjusting apparatus according to an exemplary embodiment uses the zoom optical system 28 that performs a zooming operation to realize a variable control of the irradiation range. The continuous change of the irradiation range can realize the above-described continuous light quantity adjustment.

Second Exemplary Embodiment

A light quantity adjusting apparatus according to the second exemplary embodiment includes a measurement unit (i.e., an illuminance detection sensor) and a light quantity control unit, in addition to the arrangement of the light quantity adjusting apparatus according to the first exemplary embodiment. The measurement unit according to an exemplary embodiment is configured to measure the illuminance of illumination light on an image plane of the optical system.

The light quantity control unit according to an exemplary embodiment is configured to calculate a light quantity adjustment amount based on a measurement result of the quantity of illumination light (i.e., illuminance) on the image plane, a target light quantity being set for the exposure apparatus, and a scanning speed of the stage. The light quantity control unit performs switching of ND filters and/or a zooming operation of the zoom optical system according to the calculated adjustment amount. Furthermore, in combination with a control of the number of laser pulses supplied to the light source, the light quantity control unit continuously changes the quantity of light and sets a desired level.

Third Exemplary Embodiment

Figure 2:
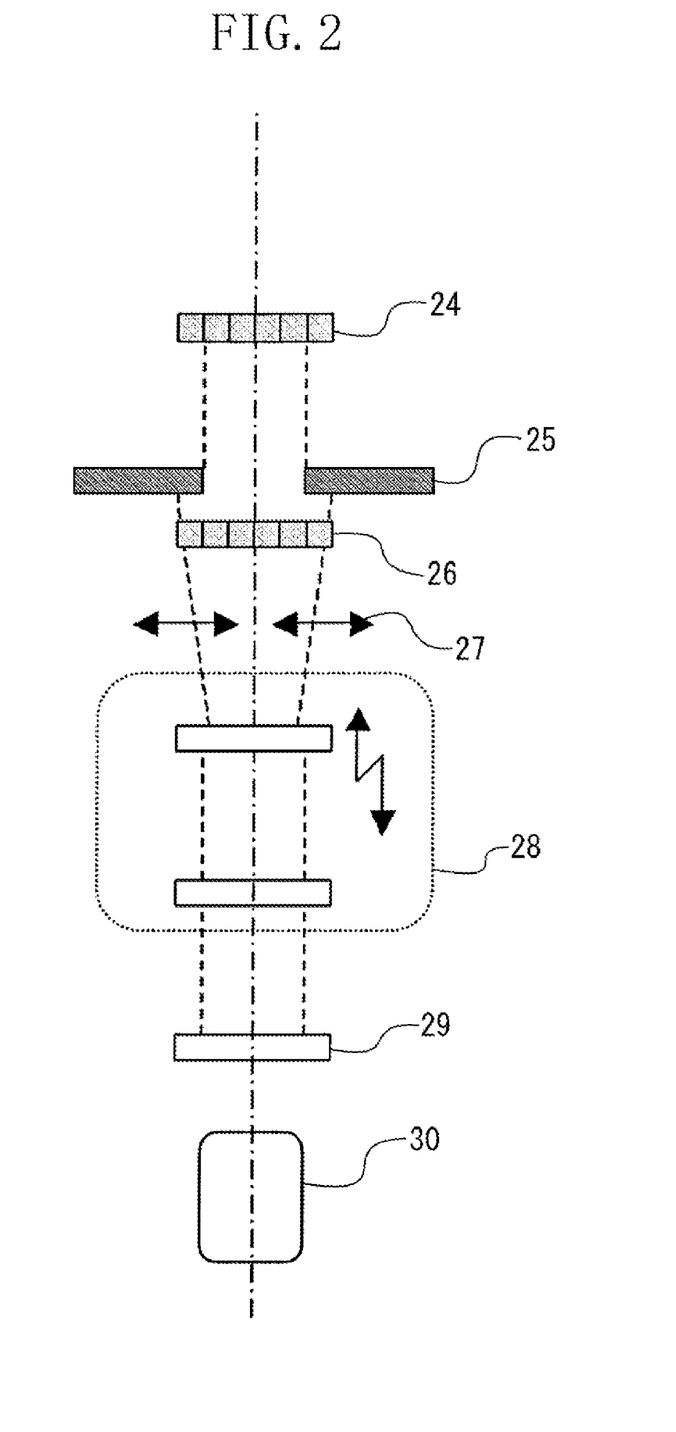
FIG. 2 illustrates a light quantity adjusting apparatus according to an exemplary embodiment f the present invention.

FIG. 2 illustrates a light quantity adjusting apparatus according to the third exemplary embodiment, which includes two optical integrators 24 and 26 in addition to the arrangement of the light quantity adjusting apparatus according to the first or second exemplary embodiment.

Both of the optical integrators 24 and 26 are disposed on the optical path of light emitted from the light source 30. The optical integrator 26 is adjacent to the light source 30 compared to the diaphragm 25. The optical integrator 24 is adjacent to a light receiving surface (i.e., a plane to be irradiated) compared to the diaphragm 25. The optical integrators 24 and 26 (i.e., a plurality of integrators) can prevent the shape of an "effective light source" from collapsing when the zoom optical system performs a zooming operation.

In this embodiment, the "effective light source" represents a distribution of light intensity on the pupil plane of the illumination optical system, corresponding to a distribution of incident angle of light relative to the light receiving surface.

The light quantity adjusting apparatus according to an exemplary embodiment can realize an optical system that does not collapse the shape of the effective light source even when the zoom optical system changes the irradiation range in a zooming operation for the light quantity adjustment.

Fourth Exemplary Embodiment

A light quantity adjusting apparatus for an illumination optical system according to the fourth exemplary embodiment includes a fixed diaphragm (i.e., light quantity adjustment unit) and a variable diaphragm. The fixed diaphragm is positioned in the optical path of the light emitted from the light source and disposed on a pupil plane of an illumination optical system.

The fixed diaphragm has a constant aperture diameter (i.e., a constant aperture area). The variable diaphragm (i.e. a diaphragm having a variable aperture area) is positioned in the optical path and disposed adjacent to the light source compared to the fixed diaphragm. The variable diaphragm can continuously change the irradiation range of the fixed diaphragm by changing the diameter of the aperture.

The light quantity adjusting apparatus can include one or more ND filters. For example, two or more ND filters are disposed on the same turret and a selected one of the ND filters can be disposed across the optical path. If two or more ND filters are used, the light quantity adjusting apparatus can realize a continuous (non-discrete) light quantity adjustment. In other words, the light quantity adjusting apparatus according to an exemplary embodiment can compensate the discreteness (i.e., stepwise changes caused by the switching of ND filters) in the light quantity adjustment according to a conventional system.

As described above, the light quantity adjusting apparatus according to an exemplary embodiment uses the variable diaphragm to continuously change the irradiation range of the fixed diaphragm and can adjust the quantity of illumination light passing through the fixed aperture (i.e., the quantity of light on the light receiving surface).

Fifth Exemplary Embodiment

A light quantity adjusting apparatus according to the fifth exemplary embodiment includes a measurement unit (i.e., an illuminance detection sensor) and a light quantity control unit, in addition to the arrangement of the light quantity adjusting apparatus according to the fourth exemplary embodiment. The measurement unit according to an exemplary embodiment is configured to measure the illuminance of illumination light on an image plane.

The light quantity control unit according to an exemplary embodiment is configured to calculate a light quantity adjustment amount on the light receiving surface based on a measurement result of the quantity of illumination light (i.e., illuminance) on the image plane, a target exposure amount being set for the exposure apparatus, and a scanning speed of the stage. The light quantity control unit performs switching of ND filters and/or an aperture area adjustment of the variable diaphragm according to the calculated adjustment amount. Furthermore, in combination with a control of the number of laser pulses emitted from the light source, the light quantity control unit continuously changes the quantity of light on the light receiving surface and sets a desired level.

Sixth Exemplary Embodiment

A light quantity adjusting apparatus according to the sixth exemplary embodiment includes a first optical integrator and a second optical integrator, in addition to the arrangement of the light quantity adjusting apparatus according to the fourth or fifth exemplary embodiment. The first and second optical integrators are positioned in the optical path of the light emitted from the light source. The first optical integrator is adjacent to the light source compared to the fixed diaphragm. The second optical integrator is adjacent to the light receiving surface compared to the fixed diaphragm. Two optical integrators (i.e., a plurality of integrators) can prevent the shape of the "effective light source" from collapsing when the variable diaphragm changes an aperture area.

Therefore, the light quantity adjusting apparatus according to an exemplary embodiment can realize an optical system that does not collapse the shape of the effective light source even when the variable diaphragm changes the irradiation range for the light quantity adjustment.

Seventh Exemplary Embodiment

Figure 3:
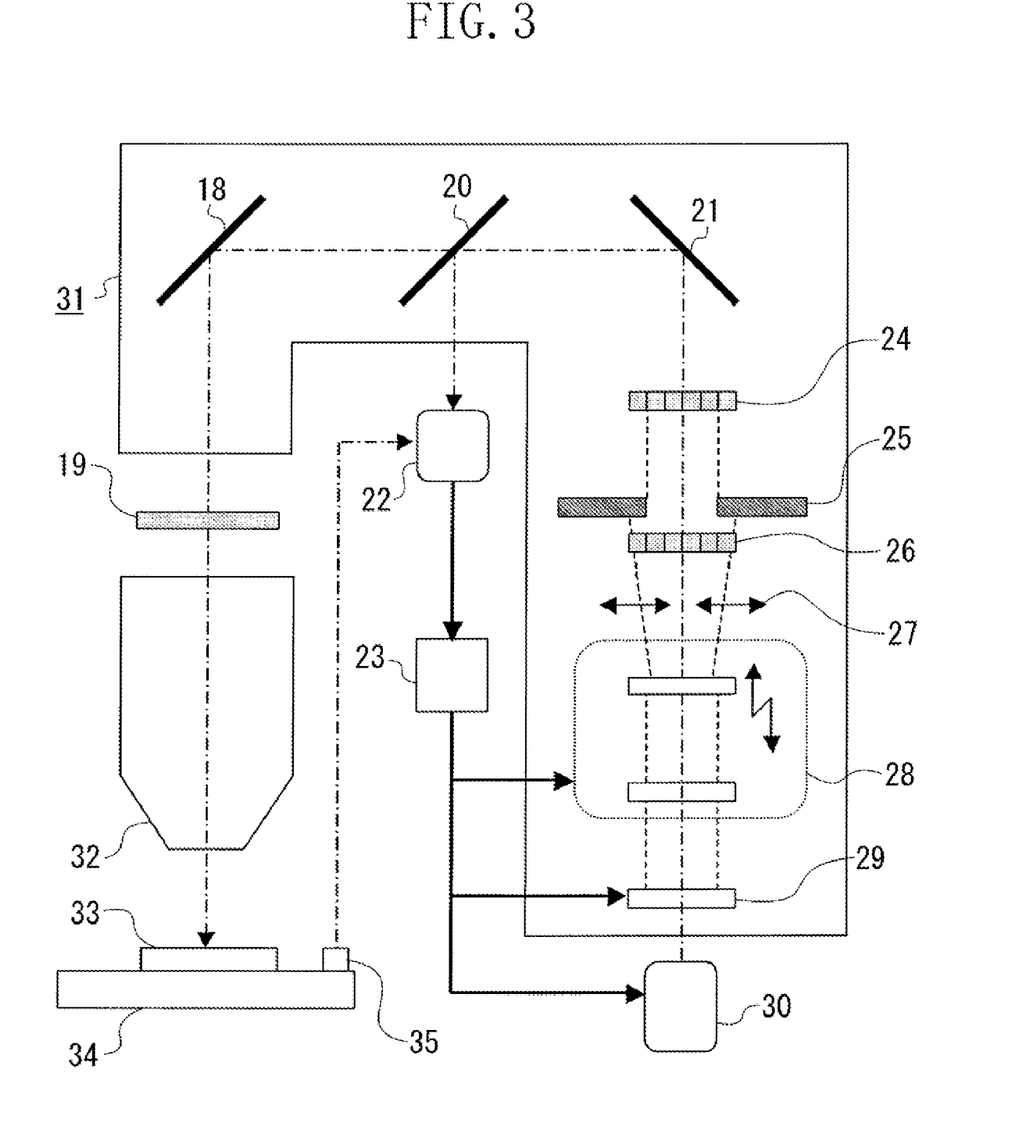
FIG. 3 illustrates an exposure apparatus according to an exemplary embodiment of the present invention.

FIG. 3 illustrates an exemplary light quantity adjusting apparatus incorporated in an exposure apparatus that is operable to form a reticle pattern on a wafer using exposure light emitted from the exposure light source. In FIG. 3, an illumination optical system 31 receives exposure light emitted from the exposure light source 30. The exposure light successively passes two folding mirrors 21 and 18 in the illumination optical system 31 and uniformly illuminates a reticle 19.

A projection optical system 32 receives the exposure light having passed through the reticle 19 and transfers a pattern of the reticle 19 onto a wafer 33 mounted on a wafer stage 34. The wafer stage 34 is equipped with an illuminance detection sensor 35 that measures the illuminance (i.e., quantity of light) at the wafer stage 34. A half mirror 20 has a function of splitting the exposure light. An illuminance detection sensor 22 measures part of the exposure light reflected on the half mirror 20.

A central processing unit (CPU) 23 receives an illuminance measurement result (i.e., an illuminance measurement value) from each of the sensors 35 and 22. The CPU 23 performs an exposure amount control based on detection signals received from the sensors 35 and 22. More specifically, the CPU 23 determines the number of oscillation pulses supplied to a laser light source (the exposure light source 30), switches the ND filters 29, and drives the zoom optical system 28.

If the setting pulse energy calculated according to a measured illuminance value is smaller than a minimum pulse energy level of the light source laser, it is required to decrease the irradiation energy per pulse.

In this case, the CPU 23 calculates a beam attenuation amount that can minimize the difference and executes an exposure amount control according to the calculated result. The control includes switching of the ND filters 29 and allocation of a beam attenuation amount in a zooming operation of the zoom optical system 28.

More specifically, the CPU 23 performs a rough adjustment of the light quantity by switching the ND filters 29 and causes the zoom optical system 28 to perform a continuous (fine) adjustment of the light quantity to completely eliminate the difference. The zoom optical system 28 can attain desired beam attenuation by combining the fixed diaphragm 25 disposed on the pupil plane and a zooming operation for enlarging/reducing the irradiation range of exposure light reaching the diaphragm 25. For example, if the irradiation range is increased, the energy density of a light flux passing through the diaphragm 25 becomes smaller compared to a value obtained when the irradiation range is narrow. As a result, the exposure amount can be decreased.

Furthermore, the illumination optical system 31 can include a plurality of integrators. The integrator 26 is adjacent to the light source 30 compared to the final integrator 24 and is positioned next to the diaphragm 25 on the pupil plane. In addition, the zoom optical system 28 can vary an irradiation range 27. Thus, the illumination optical system 31 can perform a light quantity adjustment while maintaining the shape of the effective light source.

Figure 4:
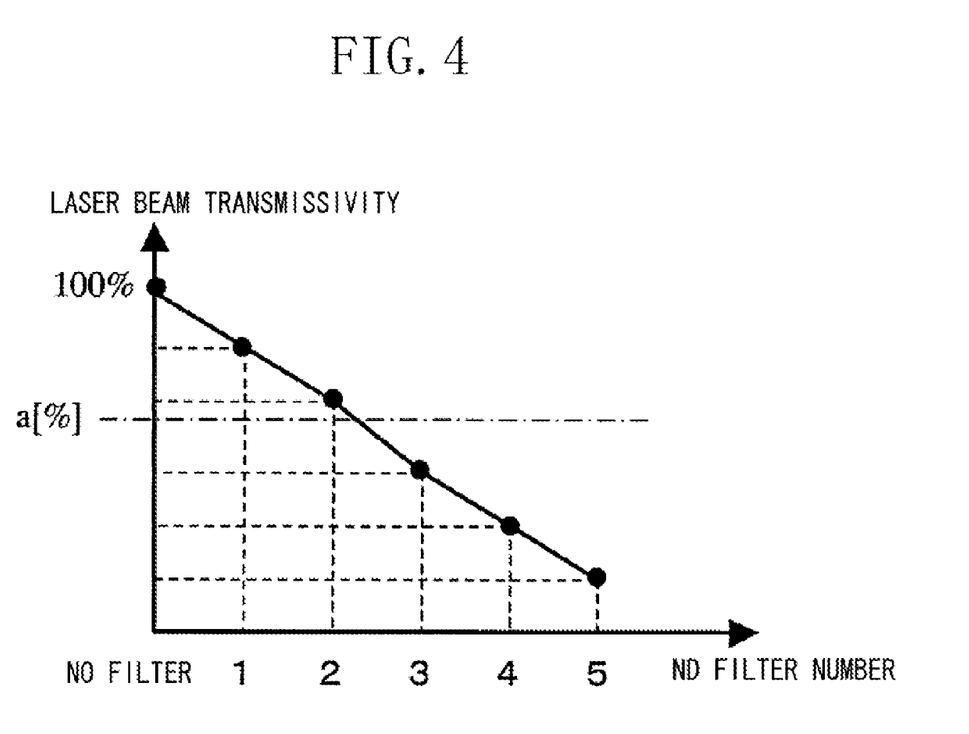
FIG. 4 is a graph qualitatively illustrating a non-discrete beam attenuation adjustment according to an exemplary embodiment of the present invention.

FIG. 4 qualitatively illustrates the effects of the above-described embodiments. As apparent from the comparison with FIG. 8 (conventional example), the laser beam transmissivity is linearly interpolated in each intermediate region between unique transmissivities (indicated by black circles) of respective ND filters. An exemplary interpolation can be a curve interpolation. As apparent from FIG. 4, the above-described embodiments can realize an arbitrarily intermediate transmissivity "a" [%] which cannot be realized in FIG. 8, to the extent that the resolution (e.g., quantization error, calculation error, etc) of the system can allow.

Eighth Exemplary Embodiment

Figure 5:
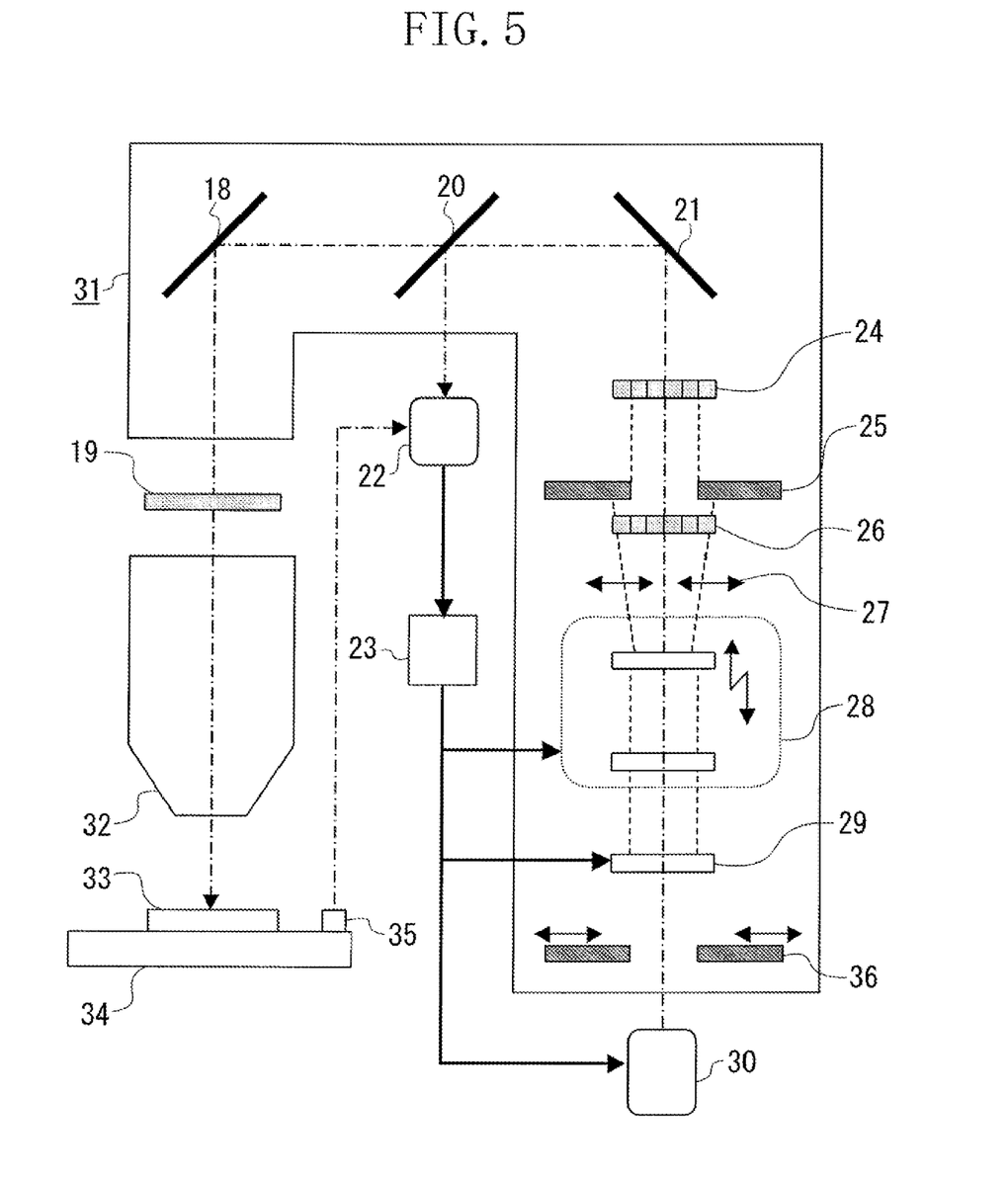
FIG. 5 illustrates an exposure apparatus according to an exemplary embodiment of the present invention.

An exposure apparatus illustrated in FIG. 5 includes a variable diaphragm 36 provided across the exposure optical path of the illumination optical system 31, in addition to the arrangement of the exposure apparatus according to the seventh exemplary embodiment. The variable diaphragm 36 can change a passing area of the exposure light.

According to the arrangement of FIG. 5, the variable diaphragm 36 is positioned at the most upstream side of the illumination optical system 31 and is adjacent to the light source 30. However, the layout of the variable diaphragm 36 is not limited to the illustrated arrangement.

If the variable diaphragm 36 reduces the passing area of the exposure light, the irradiation energy on the image plane decreases. Thus, employing the variable diaphragm 36 in addition to the exposure amount control mechanism according to the seventh exemplary embodiment enables to continuously change the irradiation range on the image plane by changing the aperture area of the variable diaphragm 36. Thus, an exemplary embodiment using the variable diaphragm 36 can improve the flexibility in the exposure amount control.

For example, if a zoom amount of the optical zoom mechanism is structurally limited and the zoom mechanism cannot attain a desired light quantity level, the variable diaphragm 36 can be combined with the optical zoom mechanism to realize a desirable light quantity adjustment at a smaller zoom amount.

A narrow beam attenuation range may be acceptable if a large number of stages (turrets 5) are provided for a plurality of ND filters. In such a case, the zoom mechanism including the zoom optical system 28 or the variable diaphragm 36 can be omitted.

Ninth Exemplary Embodiment

Figure 9:
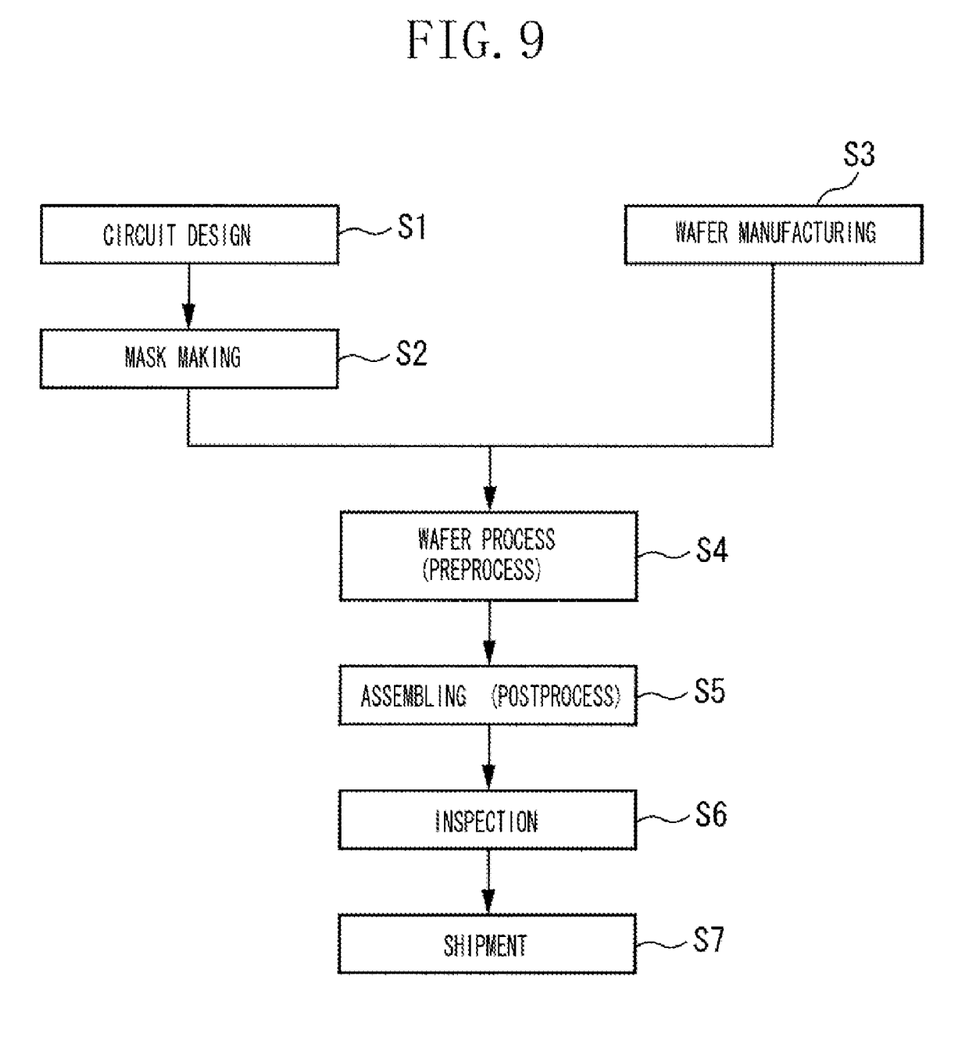
FIG. 9 is a flowchart illustrating a device manufacturing method that uses the exposure apparatus according to an exemplary embodiment of the present invention.

Next, an exemplary device manufacturing method using the above-described exposure apparatus is described below with reference to FIGS. 9 and 10. FIG. 9 is a flowchart illustrating exemplary manufacturing processes of a semiconductor device (e.g., an integrated circuit (IC), a large scale integration (LSI), a liquid crystal display (LCD), and a charge coupled device (CCD)).

Step S1 is a circuit design process for designing a circuit of a semiconductor device. Step S2 is a mask making process for fabricating a mask (which may be referred to as a reticle) that forms a designed pattern.

Step S3 is a wafer manufacturing process for manufacturing a wafer (which may be referred to as a substrate) from a silicon or comparable material. Step S4 is a wafer process (which is referred to as "preprocess") for forming an actual circuit on a wafer using an exposure apparatus with the above-described prepared mask according to the lithography technique.

Step S5 is an assembling process (which is referred to as "postprocess") for forming a semiconductor chip using the wafer manufactured in step S4. The postprocess includes an assembly process (e.g., dicing, bonding, etc) and a packaging process (chip sealing). Step S6 is an inspection process for inspecting the semiconductor device manufactured in step 5. The inspection includes an operation confirmation test and an endurance test. Step S7 is a shipment process for shipping the semiconductor device completed through the above-described processes.

Figure 10:
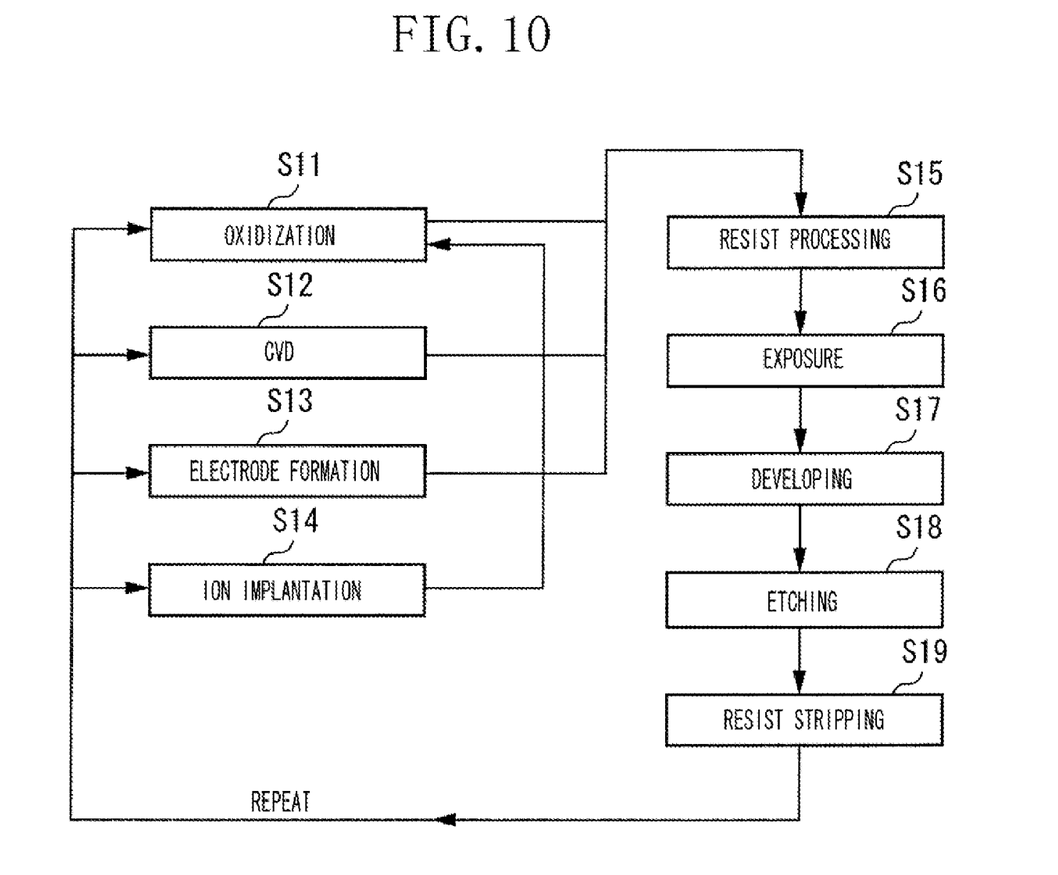
FIG. 10 is a flowchart illustrating details of a wafer process in the flowchart of FIG. 9.

As illustrated in FIG. 10, the above-described wafer process in step S4 includes an oxidation step S11 of oxidizing a wafer surface, a chemical vapor deposition (CVD) step S12 of forming an insulating film on the wafer surface, and an electrode formation step S13 of forming electrodes on the wafer by vaporization.

Furthermore, the wafer process in step S4 includes an ion implantation step S14 of implanting ions into the wafer, a resist processing step S15 of coating the wafer with a photosensitive material, and an exposure step S16 of exposing the wafer subjected to the resist processing step to light using the above-described exposure apparatus with a mask having a circuit pattern.

Furthermore, the wafer process in step S4 includes a developing step S17 of developing the wafer exposed in the exposure step S16, an etching step S18 of cutting a portion other than a resist image developed in the developing step S17, and a resist stripping step S19 of removing an unnecessary resist remaining after the etching step S18. The processing repeating the above-described steps can form multiple circuit patterns on a wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-003091 filed Jan. 11, 2007, which is hereby incorporated by reference herein in its entirety.

What is claimed is:

1. An illumination optical system which illuminates a plane to be illuminated using light from a light source, the system comprising:
   a first integrator and a second integrator disposed in order from the light source;
   a diaphragm having an aperture of constant area and disposed closer to the first integrator than to the second integrator; and
   an irradiation range adjustment unit including a zoom optical system disposed closer to the light source than the first integrator and configured to adjust an irradiation range of the light from the zoom optical system on a plane where the diaphragm is disposed, the irradiation range including the aperture of the constant area,
   wherein the irradiation range adjustment unit adjusts the irradiation range by a zooming operation of the zoom optical system, and
   wherein a shape of an effective light source on a pupil plane of the illumination optical system is not changed by adjusting the irradiation range.

2. The system according to claim 1, further comprising a variable diaphragm that has an aperture of variable area and is disposed closer to the light source than the first integrator and the zoom optical system.

3. The system according to claim 1, wherein the irradiation range adjustment unit includes a variable diaphragm having an aperture of variable area, and the quantity of illumination light on the plane to be illuminated is adjusted by changing the aperture area of the variable diaphragm.

4. The system according to claim 1, wherein the irradiation range adjustment unit changes the irradiation range to adjust a quantity of illumination light on the plane to be illuminated.

5. The system according to claim 1, further comprising a beam attenuation member.

6. The system according to claim 1, further comprising:
   a plurality of beam attenuation members; and
   a switching unit configured to insert switching a selected one of the plurality of beam attenuation members in the optical path by switching the plurality of beam attenuation members.

7. An exposure apparatus comprising:
   an illumination optical system according to claim 6,
   a projection optical system that projects a pattern image of an original onto a substrate,
   a measurement unit configured to measure a quantity of light on an image plane of the projection optical system; and
   a control unit configured to control at least one of the irradiation range adjustment unit and the switching unit based on a measurement result of the measurement unit.

8. An exposure apparatus comprising:
   an illumination optical system according to claim 1, and
   a projection optical system that projects a pattern image of an original onto a substrate.

9. The exposure apparatus according to claim 8, further comprising:
   a measurement unit configured to measure a quantity of light on an image plane of the projection optical system; and
   a control unit configured to control the irradiation range adjustment unit based on a measurement result of the measurement unit.

10. The exposure apparatus according to claim 8, wherein the pattern image of the original is projected onto the substrate by scanning the original within an illumination area of the illumination optical system and synchronously scanning the substrate within an exposure area conjugate to the illumination area.

11. The exposure apparatus according to claim 10, wherein the light source is a laser light source and the exposure apparatus further comprises:
   a laser oscillation pulse number control unit configured to control the number of oscillation pulses supplied to the laser light source;
   a measurement unit configured to measure a quantity of light on an image plane of the projection optical system; and
   a control unit configured to calculate an adjustment amount of an exposure amount at the substrate based on a setting exposure amount, a scanning speed, a measurement result of the measurement unit, and the number of oscillation pulses.

12. A method comprising:
   exposing a substrate using the exposure apparatus according to claim 8 to produce an exposed substrate;
   developing the exposed substrate; and
   processing the developed substrate to manufacture the device.

* * * * *